United States Patent
Wu et al.

(10) Patent No.: US 7,171,034 B2
(45) Date of Patent: Jan. 30, 2007

(54) METHOD AND SYSTEM FOR PHASE/AMPLITUDE ERROR DETECTION OF ALTERNATING PHASE SHIFTING MASKS IN PHOTOLITHOGRAPHY

(75) Inventors: Qiang Wu, Poughkeepsie, NY (US); Scott Bukofsky, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 844 days.

(21) Appl. No.: 10/309,403

(22) Filed: Dec. 3, 2002

(65) Prior Publication Data

US 2004/0105577 A1    Jun. 3, 2004

(51) Int. Cl.
*G06K 9/00* (2006.01)
(52) U.S. Cl. .................................. 382/144; 356/237.1
(58) Field of Classification Search ................ 382/144
See application file for complete search history.

(56) References Cited

U.S. PATENT DOCUMENTS

| | | | | |
|---|---|---|---|---|
| 5,424,154 A | * | 6/1995 | Borodovsky | 430/5 |
| 6,187,480 B1 | | 2/2001 | Huang | 430/5 |
| 6,327,033 B1 | | 12/2001 | Ferguson et al. | 356/394 |
| 6,338,922 B1 | | 1/2002 | Liebmann et al. | 430/5 |
| 6,416,909 B1 | | 7/2002 | Quek et al. | 430/5 |
| 6,436,608 B1 | | 8/2002 | Jin | 430/311 |
| 6,466,315 B1 | | 10/2002 | Karpol et al. | 356/237.4 |

OTHER PUBLICATIONS

Qiang Wu, Scott J. Bukofsky, an dShabid Butt, "Scaling Rules of Phase Error Control for the Manufacturing of Alternating Phase Shifting Masks for 193 nm Photolithography and Beyond," pp. 1-10.

* cited by examiner

*Primary Examiner*—Joseph Mancuso
*Assistant Examiner*—Kathleen Yuan
(74) *Attorney, Agent, or Firm*—Steven Capella; Cantor Colburn LLP

(57) ABSTRACT

A method for detecting phase and amplitude error of an alternating phase shifting mask is disclosed. In an exemplary embodiment, the method includes passing a collimated light beam through a pair of adjacent, phase shifted openings in the phase shifting mask. Then, the beam intensities of diffracted light passed through the pair of adjacent openings are recorded as a function of angular position. From the recorded beam intensities, an angle $\alpha$ is determined at which a first diffraction order and a second diffraction order occurs, wherein $\alpha$ represents a deviation from a pair of symmetrically distributed diffraction orders. In addition, a minimum intensity and a maximum intensity are also determined from the recorded beam intensities, wherein the phase error is calculated from the determined value of $\alpha$, and the amplitude error is calculated from the minimum intensity and said maximum intensity.

16 Claims, 4 Drawing Sheets

METHOD AND SYSTEM FOR PHASE/AMPLITUDE ERROR DETECTION OF ALTERNATING PHASE SHIFTING MASKS IN PHOTOLITHOGRAPHY

BACKGROUND

The present invention relates generally to photolithography techniques in semiconductor manufacturing and, more particularly, to a method and system for phase/amplitude error detection for alternating phase shifting masks in photolithography.

Lithography in the context of VLSI/LSI manufacturing of semiconductor devices refers to the process of patterning openings in photosensitive polymers (sometimes referred to as photoresists or resists) that define small areas in which a silicon base material is modified by a specific operation in a sequence of processing steps. The manufacturing of semiconductor devices chips involves the repeated patterning of photoresist, followed by an etch, implant, deposition, or other such operation, and ending with the removal of the expended photoresist to make way for the new resist to be applied for another iteration of this process sequence.

A basic lithography system includes a light source, a stencil or photo mask containing the pattern to be transferred to the wafer, a collection of lenses, and a means for aligning existing patterns on the wafer with patterns on the mask. The aligning may take place in an aligning step or steps, and may be carried out with an aligning apparatus. Since a wafer containing from 50 to 100 chips is patterned in steps of 1 to 4 chips at a time, these lithography tools are commonly referred to as steppers. The resolution, R, of an optical projection system such as a lithography stepper is limited by parameters described in Rayleigh's equation:

$$R = k\lambda/NA$$

wherein $\lambda$ represents the wavelength of the light source used in the projection system. NA represents the numerical aperture of the projection optics used, and "k" represents a factor describing how well a combined lithography system can utilize the theoretical resolution limit in practice.

Conventional photo masks typically include opaque chromium patterns formed on a quartz plate, thereby allowing light to pass wherever the chromium has been removed from the mask. Light of a specific wavelength is projected through the mask and onto the photoresist coated wafer, exposing the resist wherever corresponding hole patterns are placed on the mask. Exposing the resist to light of the appropriate wavelength causes modifications in the molecular structure of the resist polymers, which allow a developer to dissolve and remove the resist in the exposed areas. (In contrast, negative resist systems allow only unexposed resist to be developed away.)

The photo masks, when illuminated, can be pictured as an array of individual, infinitely small light sources which can be either turned on (points in clear areas) or turned off (points covered by chrome). If the amplitude of the electric field vector which describes the light radiated by these individual light sources is mapped across a cross section of the mask, a step function will be plotted reflecting the two possible states that each point on the mask can be found (light on, light off).

These conventional photo masks are commonly referred to as chrome on glass (COG) binary masks, due to the binary nature of the image amplitude. However, a perfectly square step function of the light amplitude exists only in the theoretical limit of the exact mask plane. At any given distance away from the mask, such as in the wafer plane, diffraction effects will cause images to exhibit a finite image slope. At small dimensions (i.e., when the size and spacing of the images to be printed are small relative to $\lambda/NA$) the electric field vectors of adjacent images will interact and add constructively. This is due to the wave nature of the radiation, in which it spreads as it propagates. As a result of this diffraction effect, the light intensity curve between the features is not completely dark, but exhibits significant amounts of light intensity created by the interaction of adjacent features. Because the resolution of an exposure system is limited by the contrast of the projected image, an increase in the light intensity in nominally dark regions will eventually cause adjacent features to print as one combined structure rather than discrete images.

The quality with which small images can be replicated in lithography depends largely on the available process latitude (i.e., the amount of allowable dose and focus variation that still results in correct image size). Phase shifted mask (PSM) lithography improves the lithographic process latitude or allows operation at a lower "k" value by introducing a third parameter on the mask. The electric field vector, like any vector quantity, has a magnitude and direction. As such, in addition to turning the electric field amplitude on and off, it can be turned on with a phase of about 0° or turned on with a phase of about 180°. This phase variation is achieved in PSMs by modifying the length that a light beam travels through the mask material. By recessing the mask to an appropriate depth, light traversing the thinner portion of the mask and light traversing the thicker portion of the masks will be 180° out of phase. In other words, their electric field vector will be of equal magnitude but point in exactly opposite directions so that any interaction between these light beams results in perfect cancellation.

Although the use of alternating phase shift masks has advantages such as improved resolution, larger exposure latitude and larger depth of focus, it can also generate overlay errors if there are phase errors or intensity transmission errors between the neighboring mark openings. For example, if the etch depth of a phase shifted opening in the quartz is incorrect, there will be a phase error associated therewith and the diffraction interference will not be completely destructive at the original symmetry axis intersecting the position of the line perpendicular to the mask plane. The position of the minimum will thus be shifted laterally in the image plane (the degree of shift being proportional to the amount of defocus), thereby causing overlay error on the wafer. In addition to phase error, there could also be an amplitude mismatch in light transmission through the two adjacent, out-of-phase openings. If this error exists, the space CD printed on the wafer will be unequal, even at best focus.

While there are certain techniques in existence that detect phase defects, they typically involve either the direct measurement of etch recess using physical probes or the combined measurements of both the asymmetry in aerial image and computer simulation. The former can be accurate in measuring the etch depths and mask dimensions, but it does not provide the data for intensity mismatch since it also depends on the light scattering characteristics, and it is not a direct measurement of phase cancellation. The latter is capable of measuring both intensity mismatch and phase error but, due to the use of computer simulation, the accuracy of the results can be subject to various approximation errors. In addition, the precise measurement of the amplitude error is difficult since it is highly dependent on the location of the best focus, which is difficult to obtain within 100 nm (1x). Accordingly, it is desirable to be able to accurately detect phase and amplitude defects independently.

SUMMARY

The foregoing discussed drawbacks and deficiencies of the prior art are overcome or alleviated by a method for detecting phase and amplitude error of an alternating phase shifting mask. In an exemplary embodiment, the method includes passing a collimated light beam through a pair of adjacent, phase shifted openings in the phase shifting mask. Then, the beam intensities of diffracted light passed through the pair of adjacent openings are recorded as a function of angular position. From the recorded beam intensities, an angle $\alpha$ is determined at which a first diffraction order and a second diffraction order occurs, wherein $\alpha$ represents a deviation from a pair of symmetrically distributed diffraction orders. In addition, a minimum intensity and a maximum intensity are also determined from the recorded beam intensities, wherein the phase error is calculated from the determined value of $\alpha$, and the amplitude error is calculated from the minimum intensity and said maximum intensity.

In another aspect, a method for detecting phase and amplitude error of an alternating phase shifting mask includes passing a collimated light beam through a pair of adjacent, phase shifted openings in the phase shifting mask. Then, the beam intensities of diffracted light passed through the pair of adjacent openings are recorded as a function of angular position, the beam intensities further being used to plot an angular distribution of diffraction curve with respect to an arc of constant radius about a centerline between the pair of adjacent openings. From the angular distribution of diffraction curve, an angle $\alpha$ is determined at which a first diffraction order and a second diffraction order occurs, wherein $\alpha$ represents a deviation from a pair of symmetrically distributed diffraction orders. In addition, a minimum intensity and a maximum intensity are determined from the angular distribution of diffraction curve, wherein the phase error is calculated from the determined value of $\alpha$, and the amplitude error is calculated from the minimum intensity and the maximum intensity.

In yet another aspect, a system for detecting phase and amplitude error of an alternating phase shifting mask includes an optical source for directing a collimated light beam through a pair of adjacent, phase shifted openings in the phase shifting mask. A photo detector detects, through an arc of constant radius about a centerline between the pair of adjacent openings, beam intensities of diffracted light passed through the pair of adjacent openings. In addition, a test apparatus is used to record, as a function of angular position, the beam intensities and to plot an angular distribution of diffraction curve. The phase error and the amplitude error are then determined from the angular distribution of diffraction curve.

BRIEF DESCRIPTION OF THE DRAWINGS

Referring to the exemplary drawings wherein like elements are numbered alike in the several Figures.

DETAILED DESCRIPTION

Disclosed herein is a method and system for both phase and amplitude error detection of alternating phase shifting masks used in semiconductor manufacturing lithography process steps. Briefly stated, a collimated laser beam is transmitted through a part of a mask having the pattern which produces total destructive interference. For example, the pattern can be two adjacent openings in the mask having a 0° and a 180° relative phase shift therebetween. Then, a photodetector, mounted on an angular stage, is moved in an arc of constant radius about the centerline between the two adjacent mask openings, thereby producing an electrical signal proportional to the received intensity of the light. By measuring the angle, $\alpha$, which represents an angular shift away from where symmetric diffraction orders would normally appear actually appear, a depth error for one of the two openings may be calculated.

Furthermore, by recording the magnitude and location for maximum and minimum intensity amplitudes about an angular area, the shape of the openings themselves may be identified for further analysis to see whether they are passing too much or too little light as a result of the shape thereof. In this manner, a more robust technique for precise phase/amplitude error is provided without a corresponding need for computer simulation and accurate determination of the best focus position.

Figure 1:
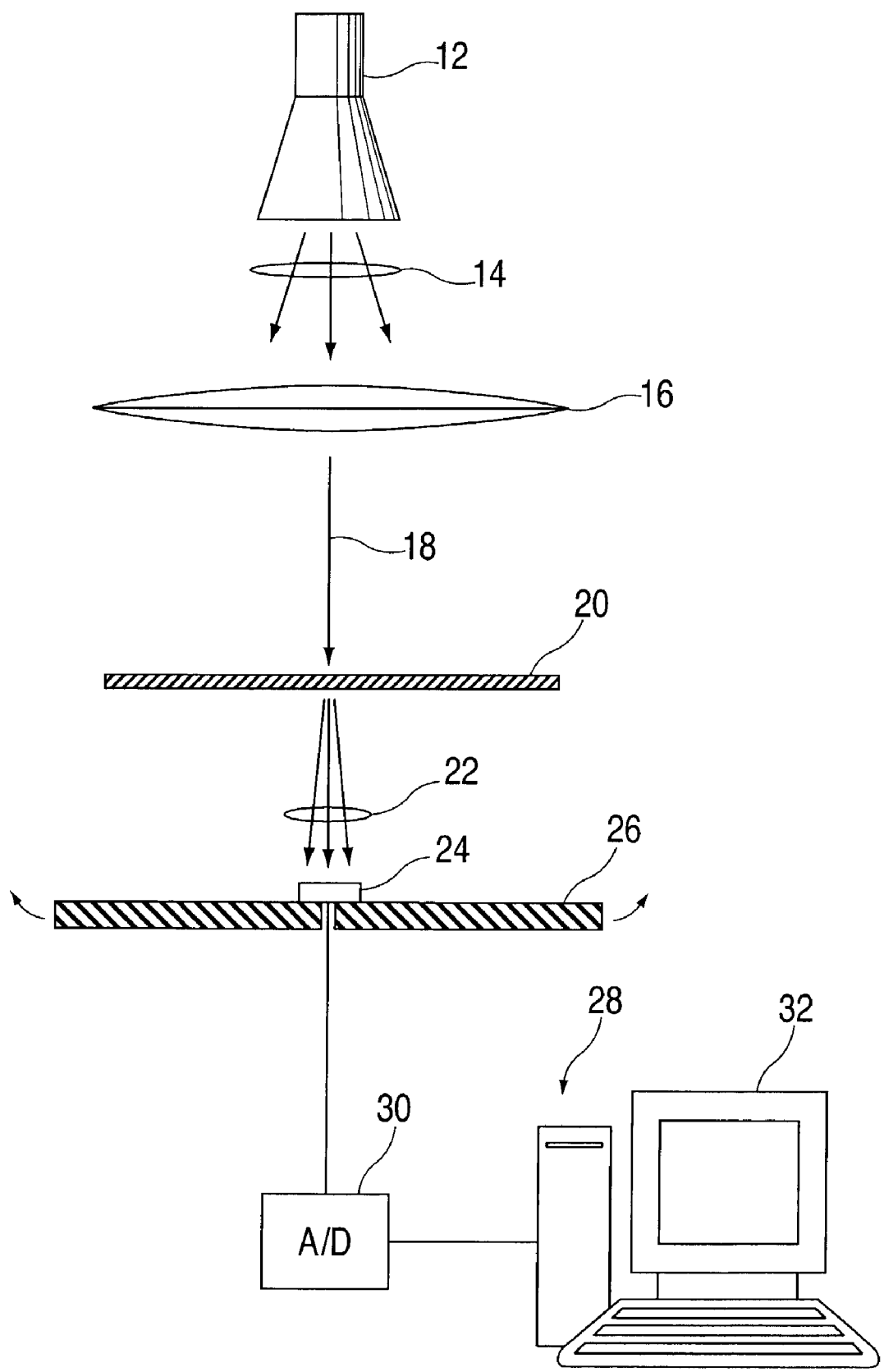
FIG. 1 is a schematic diagram of an inspection system 10 suitable for use in accordance with an embodiment of the invention.

Referring initially to FIG. 1, there is shown a schematic diagram of an inspection system 10 suitable for use in accordance with an embodiment of the invention. It should be appreciated, however, that the specific components therein are illustrated by way of example only, and thus equivalent and/or additional components known to those skilled in the art may be utilized. An optical source 12, such as a laser or other suitable optical generating device produces an illumination beam 14 of relatively narrow diameter. A collimating lens 16 may be used to collimate the illumination beam 14 or, alternatively, the optical source 12 may be selected from a type designed to emit a collimated beam, such as a collimated diode laser. In either case, a collimated beam 18 is incident upon (and transmitted through) an area of interest on an alternating phase shifting mask 20 under test, at a normal angle thereto.

The intensity of the transmitted light 22 through the phase shifting mask 20 is then detected by a photo detector 24 mounted upon an angular stage 26. Unlike conventional x-y stages used in existing test methods, the angular stage 26 is further capable of movement in an arc of constant radius about the centerline between a pair of adjacent mask openings. In an exemplary embodiment, the angular stage 26 may have a radius of about 20 cm. As such, an angular rotation of one minute (1/60 degree) translates into an angular distance of about 58 microns, and is fairly easily attainable on commercially available resolving systems that actually have an accuracy of about 100 micro radians (1/200 degrees).

Preferably, the photo detector 24 is of a single-slit or "pinhole" type, as known to those skilled in the art. Alternatively, the detector 24 may configured to cover a larger area, such as with a charge coupled device (CCD) array, so long as the intensities of the diffraction orders of the transmitted light are capable of being measured (or calculated) over a desired angular range. The measured intensity signals of the diffraction orders are then recorded by a test apparatus, designated generally at 28, which preferably includes an analog-digital converter 30 and a computer processing device 32 for processing of the intensity signal data.

Figure 2:
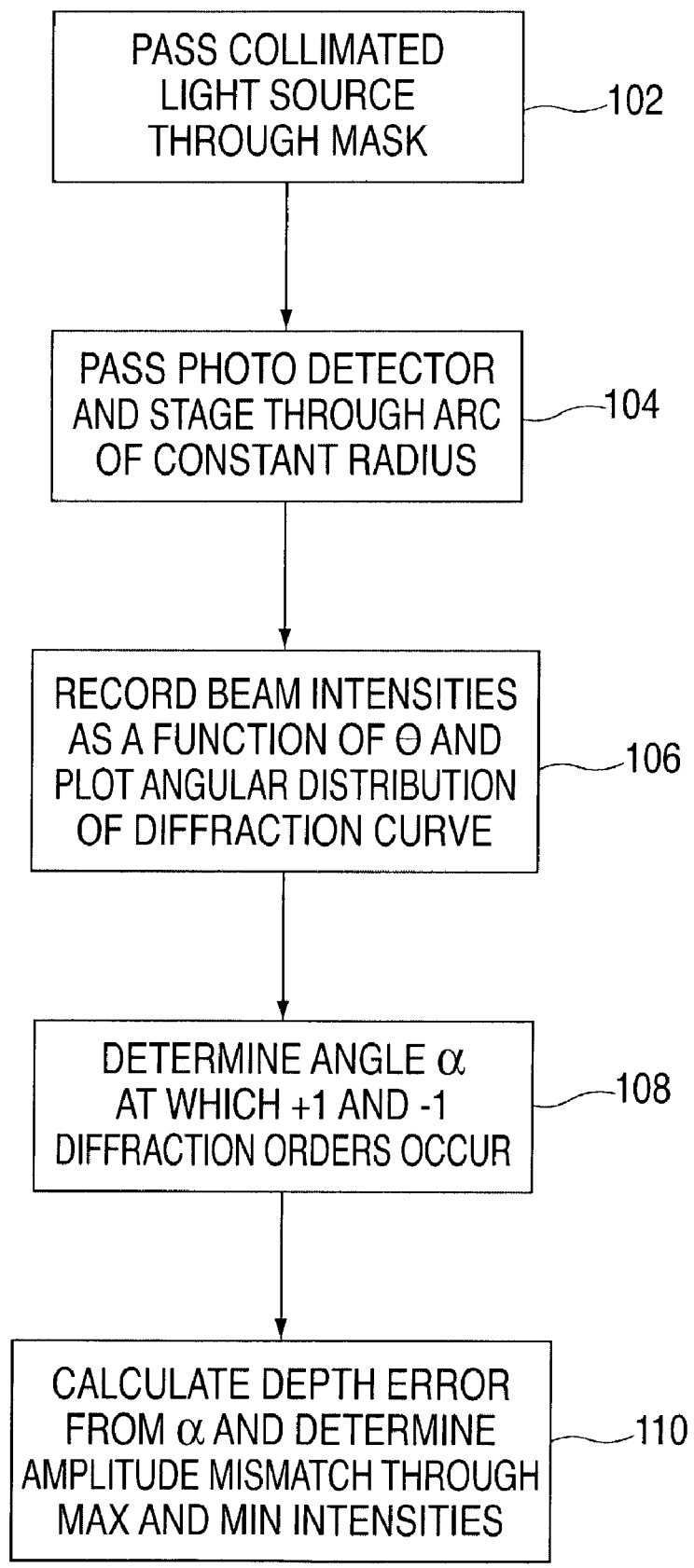
FIG. 2 is a block diagram illustrating a method for phase and amplitude error detection of alternating phase shifting masks, in accordance with an embodiment of the invention.

FIG. 2 is a block diagram illustrating a method 100 for phase and amplitude error detection of alternating phase shifting masks, in accordance with an embodiment of the invention, and which may be implemented through the inspection system 10 shown in FIG. 1. As denoted in block 102, a collimated light source is passed through the transmissive portions of an alternative phase shifting mask. Again, it is noted that the incident beam thereupon is directed at a normal angle with respect to the mask. Then, at block 104, the angular stage and photo detector are passed through successive points along an arc of constant radius (denoted hereinafter as the θ-axis, or θ) with respect to the mask. At each successive point on the θ-axis, the diffraction beam intensity of the transmitted light is recorded, and an angular distribution of diffraction curve is thereby plotted, as indicated in block 106.

Alternatively, however, the photo detector (or even an array of photo detectors) may be mounted on a non-angular stage, in a straight line with respect to the diffraction, so long as the intensity recordings are then converted to a corresponding angular value.

Given this intensity versus angle information, both phase error and amplitude mismatch information may then be determined from a single plot. As indicated at block 108, an angular shift a may be determined from the measured intensity data, wherein a represents the deviation of the diffraction orders from symmetry about the centerline defined between adjacent mask openings. If there is a depth error in one of the adjacent mask openings, there will be associated therewith a shift in the diffraction orders. This principle is perhaps more easily understood with reference to FIGS. 3 and 4.

Figure 3:
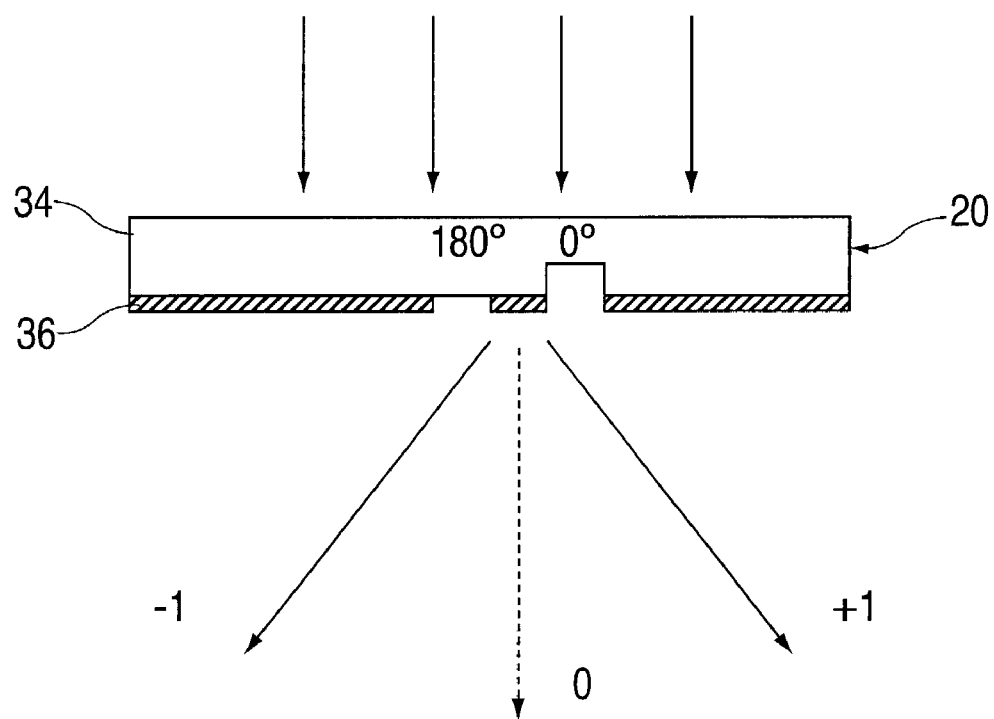
FIG. 3 is a schematic diagram illustrating the symmetrically distributed diffraction orders of a beam of light passing through a pair of adjacent openings in an alternating phase shifting mask, when no phase error is present.
Figure 4:
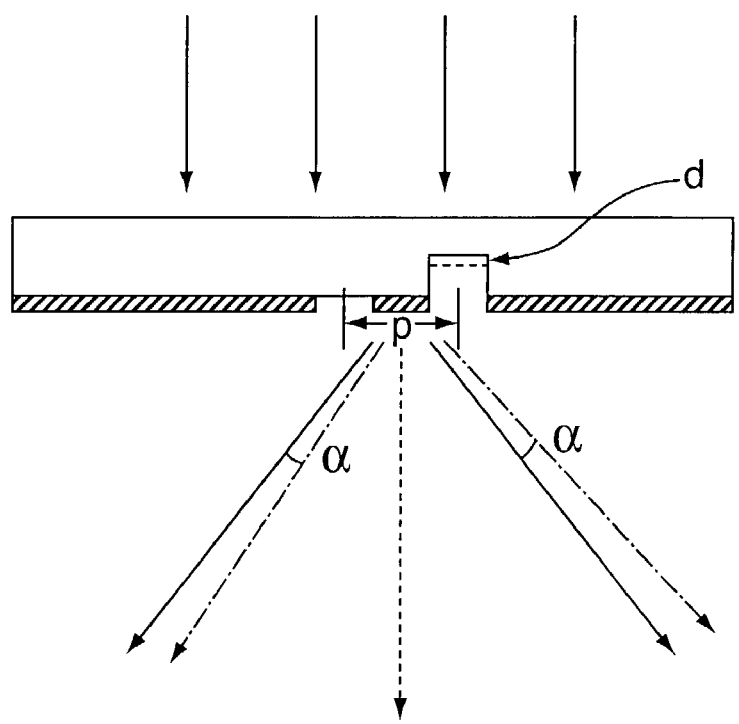
FIG. 4 is a schematic diagram illustrating a deviation from the symmetrically distributed diffraction orders of a beam of light passing through a pair of adjacent openings in an alternating phase shifting mask, when a phase error is present.

As shown in FIG. 3, an ideally formed alternating phase shifting mask 20 includes transmissive layer 34 (e.g., glass, quartz) and opaque layer 36 (e.g., chrome), with a 0° opening and a 180° opening defined within removed portions of the opaque layer 36. Ideally, the exposure light emerging from the from the 0° opening and from the 180° opening is of equal intensity. As a result of the phase difference between the two openings, a collimated beam normal to the surface of the mask will produce two major and symmetrically distributed diffraction orders (−1 and +1), while the 0$^{th}$ diffraction order is nulled by symmetry. On the other hand, a mask with a phase error due to an incorrect opening depth will generate the same diffraction pattern, but rotated by the angle, α, as shown in FIG. 4.

The angle deviation a is related to error depth through the equation:

$$\alpha = d(n-1)/p;$$

wherein n is the index of refraction of the transmissive portion of the mask, p is the center-to-center distance between the openings, and d is the depth error that is representative of a deviation from the half wavelength differential between openings. Since the center-to-center distance (p) is determined during the mask manufacture (and is therefore assumed to be a parameter that must be maintained within a desired tolerance) the nominal value thereof is assumed for calculation purposes without a specific measurement thereof in method 100.

Accordingly, once a is determined from the diffraction distribution curve, the depth error may be calculated, as reflected in block 110 of FIG. 2. More specifically, a depth error represents a deviation of one or both of the mask openings from a difference in relative path lengths therebetween that is equal to an odd number of half wavelengths. Finally, (as is also shown in block 110 of FIG. 2), any amplitude (transmission) mismatch is also determined from the measured intensity data and, more specifically, from a determination of the minimum and maximum intensities (denoted hereinafter as $I_{min}$ and $I_{max}$).

Ideally, $I_{min}$ is zero. However, this condition only occurs if the mask openings are formed such that exactly the same amount of light is transmitted through each, thereby completely canceling one another out. In reality, there will be some small positive value of $I_{min}$. The degree to which $I_{min}$ compares to $I_{max}$ is thus more useful in determining whether there is an amplitude mismatch, signifying that one or both openings pass too much/too little light. With this information, the mask can then be further analyzed, such as by scanning electron microscope (SEM), ultraviolet technique or otherwise, to determine which opening is too wide, too narrow, incorrect shape, etc. The results of a mismatch calculation provide an indication of how well the goal is attained.

Figure 5:
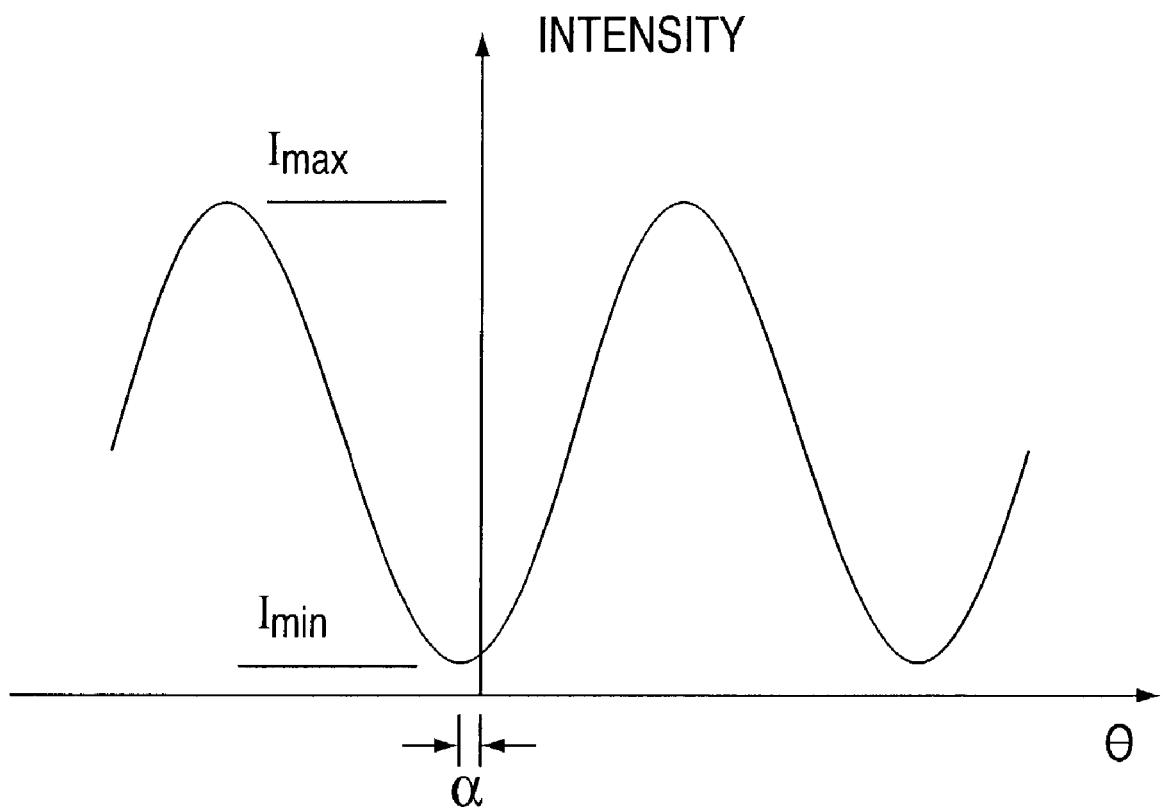
FIG. 5 is an exemplary intensity versus angle plot, generated in accordance with the method illustrated in FIG. 2, particularly illustrating the angular distribution of diffraction when both a phase error and an amplitude mismatch condition exist at a given location of the alternating phase shifting mask.

FIG. 5 is an exemplary intensity versus angle plot, generated in accordance with the method illustrated in FIG. 2, particularly illustrating the angular distribution of diffraction when both a phase error and an amplitude mismatch condition exist at a given location of the alternating phase shifting mask. The angular shift α is observed by the displacement of the location of the minimum intensity $I_{min}$ from the origin at θ=180° (i.e., the midpoint between the center lines of the adjacent openings). In addition, the measurement of both $I_{max}$ and $I_{min}$ provides information on mismatch between the openings.

The angular distribution of the intensity is a function of the amplitude of the scattered waves, denoted by $a_1$ and $a_2$, and is given by the periodic function:

$$I = a_1^2 + a_2^2 + a_1 a_2 \cos\theta;$$

wherein $I_{min} = (a_1 - a_2)^2$ and $I_{max} = (a_1 + a_2)^2$.
The ratio $I_{min}/I_{max}$ may be expressed as:

$$(I_{min}/I_{max})^{1/2} = (a_1 - a_2)/(a_1 + a_2) = (1 - a_2/a_1)/(1 + a_2/a_1),$$

thus $$1 - a_2/a_1 = (1 + a_2/a_1)(I_{min}/I_{max})^{1/2}$$

If the amplitude mismatch, m, is defined as $1 - (a_2/a_1)^2$, then the measurement of $I_{min}$ and $I_{max}$ may be used to determine m, since:

$$m = 1 - (a_2/a_1)^2 = (1 + a_2/a_1)(1 - a_2/a_1);$$

and, if the mismatch is small, or $a_2 \approx a_1$, then $m \approx 2(1 - a_2/a_1) \approx 4(I_{min}/I_{max})^{1/2}$.

As will be appreciated, the above described method (and associated system embodiment) provides a simple and accurate means of characterizing the phase/amplitude matching accuracy between phase-separated regions of an alternating phase shifted lithographic mask through laser interferometric techniques. By obtaining and plotting an angular profile of the diffraction beam intensities, both the intensity and the diffraction shift information may be obtained from a single plot and separated from one another for appropriate calculations of depth error and amplitude mismatch. This error information may then be used to further analyze the individual mask characteristics and fabrication process steps thereof.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for detecting phase and amplitude error of an alternating phase shifting mask, the method comprising:
    passing a collimated light beam through a pair of adjacent, phase shifted openings in the phase shifting mask;
    recording, as a function of angular position, beam intensities of diffracted light passed through said pair of adjacent openings;
    determining, from said recorded beam intensities, an angle α at which a first diffraction order and a second diffraction order occurs, wherein α represents a deviation from a pair of symmetrically distributed diffraction orders; and
    determining, from said recorded beam intensities, a minimum intensity and a maximum intensity;
    wherein the phase error is calculated from the determined value of α, and the amplitude error is calculated from said minimum intensity and said maximum intensity.

2. The method of claim 1, wherein the phase error is expressed in terms of a depth error, said depth error being calculated by using α, an index of refraction of a transmissive layer of the mask, and a center separation distance between said pair of adjacent openings.

3. The method of claim 2, wherein said depth error, d, is calculated in accordance with time equation:

$$\alpha = d(n-1)/p;$$

wherein n is said index of refraction and p is said center separation distance.

4. The method of claim 1, wherein the amplitude error is determined from a ratio between said minimum intensity and said maximum intensity.

5. The method of claim 1, wherein said angle α, said minimum intensity and said maximum intensity are determined from an angular distribution of diffraction curve plotted from said recorded beam intensities.

6. A method for detecting phase and amplitude error of an alternating phase shifting mask, the method comprising:
    passing a collimated light beam through a pair of adjacent, phase shifted openings in the phase shifting mask;
    recording, as a function of angular position, beam intensities of diffracted light passed through said pair of adjacent openings, said beam intensities further being used to plot an angular distribution of diffraction curve with respect to an arc of constant radius about a centerline between said pair of adjacent openings;
    determining, from said angular distribution of diffraction curve, an angle α at which a first diffraction order and a second diffraction order occurs, wherein α represents a deviation from a pair of symmetrically distributed diffraction orders; and
    determining, from said angular distribution of diffraction curve, a minimum intensity and a maximum intensity;
    wherein the phase error is calculated from the determined value of α, and the amplitude error is calculated from said minimum intensity and said maximum intensity.

7. The method of claim 6, wherein said beam intensities are recorded with a photo detector.

8. The method of claim 7, wherein said photo detector is passed through said arc of constant radius.

9. The method of claim 6, wherein the phase error is expressed in terms of a depth error, said depth error being calculated by using α, an index of refraction of a transmissive layer of the mask, and a center separation distance between said pair of adjacent openings.

10. The method of claim 9, wherein said depth error, d, is calculated in accordance with the equation:

$$\alpha = d(n-1)/p;$$

wherein n is said index of refraction and p is said center separation distance.

11. The method of claim 6, wherein the amplitude error is determined from a ratio between said minimum intensity and said maximum intensity.

12. The method of claim 6, wherein said collimated light beam is incident upon the mask at a normal angle thereto.

13. A system for detecting phase and amplitude error of an alternating phase shifting mask, comprising:
    an optical source for directing a collimated light beam through a pair of adjacent, phase shifted openings in the phase shifting mask;
    a photo detector for detecting, through an arc of constant radius about a centerline between said pair of adjacent openings, beam intensities of diffracted light passed through said pair of adjacent openings; and
    a test apparatus for recording, as a function of angular position, said beam intensities, said test apparatus further using said beam intensities to plot an angular distribution of diffraction curve;
    said test apparatus further comprising a computer processing device for determining, from said angular distribution of diffraction curve an angle α at which a first diffraction order and a second diffraction order occurs, wherein α represents a deviation from a pair of symmetrically distributed diffraction orders
    said computer processing device configured to compute a depth error, d, using α, an index of refraction of a transmissive layer of the mask, and a center separation distance between said pair of adjacent openings, in accordance with the equation:

$$\alpha = d(n-1)/p;$$

wherein n is said index of refraction and p is said center separation distance; and
    wherein the phase error and the amplitude error are determined from said angular distribution of diffraction curve.

14. The system of claim 13, wherein said photo detector is configured upon an angular stage, said angular stage being adjustably movable about said an arc of constant radius.

15. The system of claim 13, wherein said computer processing device determines the amplitude error from a ratio between a minimum intensity and a maximum intensity from said angular distribution of diffraction curve.

16. The system of claim 13, wherein said photo detector further comprises a pinhole detector.

* * * * *